(12) United States Patent
Park et al.

(10) Patent No.: US 11,910,647 B2
(45) Date of Patent: Feb. 20, 2024

(54) DISPLAY APPARATUS

(71) Applicant: SAMSUNG DISPLAY CO., LTD., Yongin-si (KR)

(72) Inventors: Hyunae Park, Yongin-si (KR); Sunghwan Kim, Yongin-si (KR); Daehyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 17/368,832

(22) Filed: Jul. 7, 2021

(65) Prior Publication Data

US 2022/0140037 A1 May 5, 2022

(30) Foreign Application Priority Data

Oct. 29, 2020 (KR) .................. 10-2020-0142518

(51) Int. Cl.
| | |
|---|---|
| *G09G 3/3233* | (2016.01) |
| *H10K 59/121* | (2023.01) |
| *G09G 3/3291* | (2016.01) |
| *G09G 3/3266* | (2016.01) |
| *H10K 59/131* | (2023.01) |

(52) U.S. Cl.
CPC ....... *H10K 59/1213* (2023.02); *G09G 3/3233* (2013.01); *G09G 3/3266* (2013.01); *G09G 3/3291* (2013.01); *H10K 59/1216* (2023.02); *H10K 59/131* (2023.02); *G09G 2330/08* (2013.01)

(58) Field of Classification Search
CPC ... G09G 3/3233; G09G 3/3266; G09G 3/3291
See application file for complete search history.

(56) References Cited

U.S. PATENT DOCUMENTS

| | | | |
|---|---|---|---|
| 7,019,717 | B2 | 3/2006 | Yumoto et al. |
| 8,422,190 | B2 | 4/2013 | Ito et al. |
| 10,658,444 | B2 | 5/2020 | Kang et al. |
| 2016/0070130 | A1* | 3/2016 | Yuminami ............ G02F 1/1339 349/110 |
| 2020/0044009 | A1 | 2/2020 | Kwak et al. |

FOREIGN PATENT DOCUMENTS

| | | |
|---|---|---|
| KR | 10-2008-0066153 | 7/2008 |
| KR | 10-0842721 | 7/2008 |
| KR | 10-1174327 | 8/2012 |
| KR | 10-2019-0142469 | 12/2019 |
| KR | 10-2020-0016425 | 2/2020 |

* cited by examiner

*Primary Examiner* — Kevin M Nguyen
(74) *Attorney, Agent, or Firm* — H.C. Park & Associates, PLC

(57) ABSTRACT

A display apparatus, which may prevent a defect of a pixel due to external electrostatic discharge, includes: a first pixel including a first node; a second pixel neighboring the first pixel and including a second node; and an always-off thin-film transistor including a first electrode, a second electrode, and a gate electrode, the first electrode being connected to the first node of the first pixel, the second electrode being connected to the second node of the second pixel, in which a turn-off voltage is applied to the gate electrode.

20 Claims, 8 Drawing Sheets

DISPLAY APPARATUS

CROSS-REFERENCE TO RELATED APPLICATION

This application claims priority from and the benefit of Korean Patent Application No. 10-2020-0142518, filed on Oct. 29, 2020, which is hereby incorporated by reference for all purposes as if fully set forth herein.

BACKGROUND

Field

Embodiments of the invention relate generally to a display apparatus.

Discussion of the Background

A display apparatus visually displays data. Display apparatuses are used as displays of miniaturized products such as mobile phones or tablet computers, and used as displays of large-scale products such as large-screen televisions.

A display apparatus includes a plurality of pixels each receiving an electric signal and emitting light to display an image to the outside. Each pixel includes a light-emitting element. As an example, an organic light-emitting display apparatus includes an organic light-emitting diode (OLED) as a light-emitting element. Generally, an organic light-emitting display apparatus operates by including a thin-film transistor and an organic light-emitting diode over a substrate and allowing the organic light-emitting diode to simultaneously emit light.

Recently, as the purposes of a display apparatus have diversified, designs that improve the quality of a display apparatus have been tried in various ways.

The above information disclosed in this Background section is only for understanding of the background of the inventive concepts, and, therefore, it may contain information that does not constitute prior art.

SUMMARY

Devices constructed according to illustrative implementations of the invention are capable of resolving a potential problem in a display device by preventing a defect of one or more pixels of the display device from being caused by external electrostatic discharge due to a semiconductor pattern that is formed as an island shape on a wafer or a substrate.

This potential problem may be resolved by forming a semiconductor pattern as one body in substantially one direction on a substrate or wafer, to thereby dissipate any externally-provided electrostatic discharge to the semiconductor pattern along the one direction, and thereby reduce or eliminate any potential damage to a pixel created by way of the semiconductor pattern.

One or more embodiments include a display apparatus that may prevent a defect of a pixel from being caused by external electrostatic discharge.

Technical issues pursued by the present disclosure are not limited to those mentioned above, and other technical issues not mentioned would be clearly understood by those of ordinary skill in the art.

Additional features of the inventive concepts will be set forth in the description which follows, and in part will be apparent from the description, or may be learned by practice of the inventive concepts.

According to one or more embodiments, a display apparatus includes a first pixel including a first node, a second pixel neighboring the first pixel and including a second node, and an always-off thin-film transistor including a first electrode, a second electrode, and a gate electrode, the first electrode being connected to the first node of the first pixel, the second electrode being connected to the second node of the second pixel, wherein a turn-off voltage is applied to the gate electrode.

The always-off thin-film transistor may include a semiconductor pattern connecting the first node to the second node.

The first pixel may include a first light-emitting element, a first driving thin-film transistor configured to control a current flowing through the first light-emitting element according to a gate-source voltage, the first node to which a driving voltage is applied, a first emission control thin-film transistor configured to connect the first node to a source of the first driving thin-film transistor in response to an emission control signal, and a first gate initialization thin-film transistor configured to apply a first initialization voltage to a gate of the first driving thin-film transistor in response to a first scan signal.

The turn-off voltage may be the driving voltage.

The second pixel may include a second light-emitting element, a second driving thin-film transistor configured to control a current flowing through the second light-emitting element according to a gate-source voltage, a second gate initialization thin-film transistor configured to apply the first initialization voltage to a gate of the second driving thin-film transistor in response to a second scan signal, and the second node to which the first initialization voltage is applied when the second gate initialization thin-film transistor is turned on in response to the second scan signal.

The second gate initialization thin-film transistor may include a plurality of thin-film transistors connected to each other in series, and the second node may be arranged between the plurality of thin-film transistors.

The second node may be in a floated state when the plurality of thin-film transistors are turned off in response to the second scan signal.

The first pixel may further include an anode initialization thin-film transistor configured to apply a second initialization voltage to an anode of the first light-emitting element in response to the second scan signal.

The first pixel may further include a storage capacitor including a top electrode and a bottom electrode, the driving voltage being applied to the top electrode, and the bottom electrode being connected to a gate of the first driving thin-film transistor, a scan thin-film transistor configured to transfer a data voltage to the source of the first driving thin-film transistor in response to a third scan signal, a compensation thin-film transistor configured to operate in response to the third scan signal and connected between a drain and the gate of the first driving thin-film transistor, and a second emission control thin-film transistor configured to connect the drain of the first driving thin-film transistor to the anode of the first light-emitting element in response to the emission control signal.

The second pixel may include a second light-emitting element, a second driving thin-film transistor configured to control a current flowing through the second light-emitting element according to a gate-source voltage, and a second gate initialization thin-film transistor configured to apply the first initialization voltage to the gate of the second driving thin-film transistor in response to a second scan signal, wherein the second node may be a source or a drain of the second gate initialization thin-film transistor.

The display apparatus may further include a data line extending in a first direction, wherein the first pixel may neighbor the second pixel in the first direction.

The first pixel may be electrically insulated from the second pixel by the always-off thin-film transistor.

The gate electrode of the always-off thin-film transistor may be connected to the first electrode, and the turn-off voltage may be applied to the first electrode.

According to one or more embodiments, a display apparatus includes a plurality of pixels each arranged in a first direction and including a light-emitting element, a first node, and a second node, a driving voltage being applied to the first node, and a first initialization voltage being selectively applied to the second node, and a plurality of always-off thin-film transistors alternately arranged with the plurality of pixels in the first direction, wherein each of the plurality of always-off thin-film transistors physically connects the first node of a first pixel to the second node of a second pixel from among two neighboring pixels of the plurality of pixels.

The display apparatus may further include a semiconductor pattern as one body that continuously extends in the first direction, wherein the semiconductor pattern may include a plurality of pixel areas and a plurality of transistor areas, the plurality of pixel areas being respectively included in the plurality of pixels, and the plurality of transistor areas being respectively included in the plurality of always-off thin-film transistors.

Each of the plurality of pixels may include a driving thin-film transistor configured to control a current flowing through the light-emitting element according to a gate-source voltage, a scan thin-film transistor configured transfer a data voltage to the driving thin-film transistor in response to a first scan signal, and a storage capacitor including a first electrode and a second electrode, the first electrode being connected to a gate of the driving thin-film transistor.

Each of the plurality of pixels may further include a compensation thin-film transistor configured to connect a drain to the gate of the driving thin-film transistor in response to the first scan signal.

Each of the plurality of pixels may further include a gate initialization thin-film transistor configured to apply the first initialization voltage to the gate of the driving thin-film transistor in response to the second scan signal.

Each of the plurality of pixels may further include a first emission control thin-film transistor configured to connect the first node to a source of the driving thin-film transistor in response to an emission control signal, and a second emission control thin-film transistor configured to connect the drain of the driving thin-film transistor to an anode of the light-emitting element in response to the emission control signal.

Each of the plurality of pixels may further include an anode initialization thin-film transistor configured to apply a second initialization voltage to the anode of the light-emitting element in response to a third scan signal.

These general and specific aspects may be implemented by using a system, a method, a computer program, or a combination of a certain system, method, and computer program.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
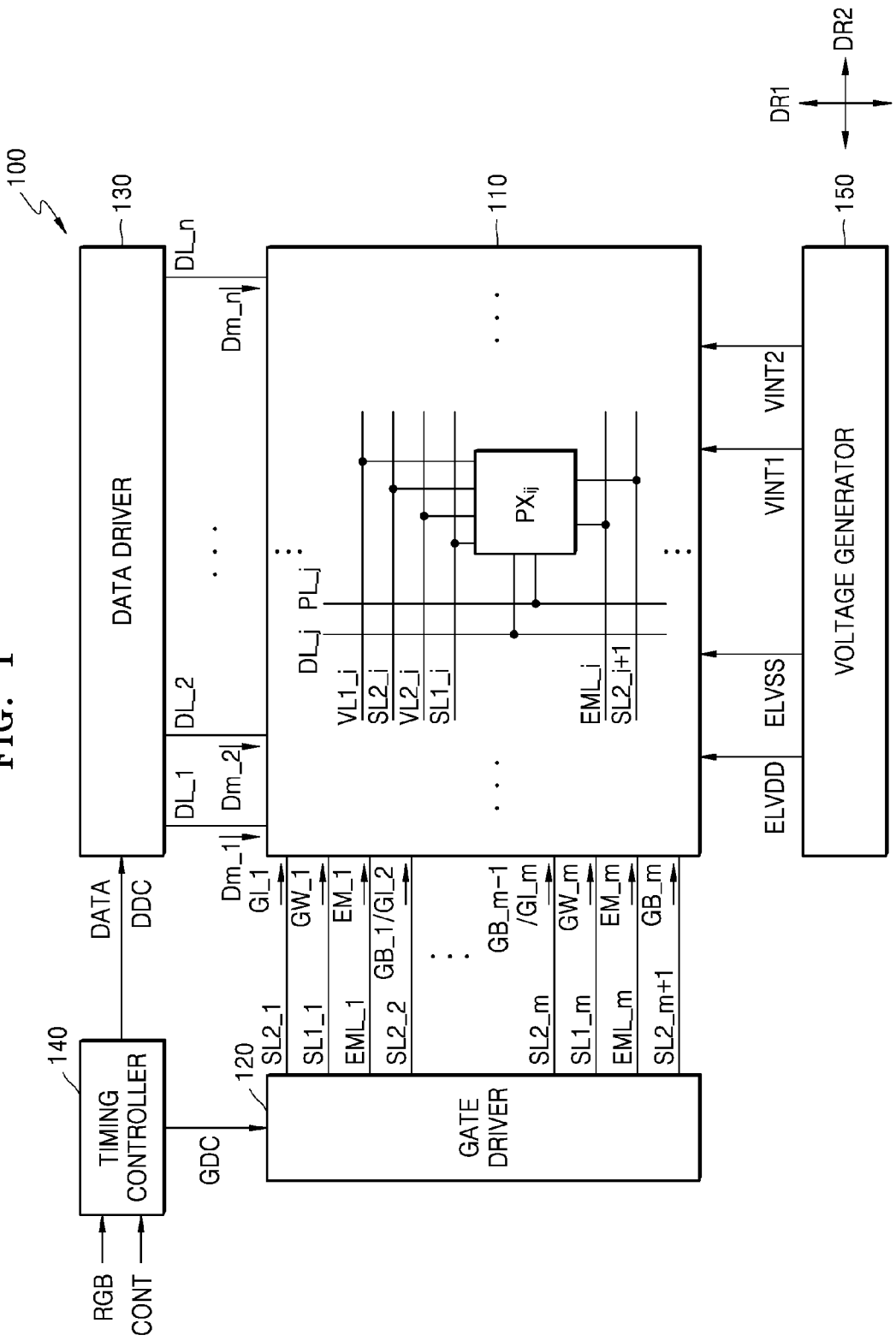
FIG. 1 is a block diagram of a display apparatus according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of a display apparatus according to an embodiment. The display apparatus may be an organic light-emitting display apparatus 100 including a light-emitting element in which brightness is changed by a current, for example, an organic light-emitting diode. The case where the display apparatus is the organic light-emitting display apparatus 100 is mainly described below.

Referring to FIG. 1, the organic light-emitting display apparatus 100 as the display apparatus includes a display unit 110, a gate driver 120, a data driver 130, a timing controller 140, and a voltage generator 150.

The display unit 110 includes pixels PX including a pixel $PX_{ij}$ arranged on an i-th row and a j-th column. Though FIG. 1 shows only one pixel $PX_{ij}$ for easy understanding, (m×n) pixels PX may be arranged, for example, in a matrix configuration. Here, i is a natural number (i.e., an integer value) equal to or greater than 1 and equal to or less than m. j is a natural number (i.e., an integer value) equal to or greater than 1 and equal to or less than n.

For convenience of description only, it is described with reference to FIG. 1, that a pixel PX includes seven transistors and one capacitor. However, the embodiments described herein are not limited thereto, and a pixel PX may employ another pixel circuit, for example, a pixel circuit including two transistors and one capacitor.

Pixels PX are connected to first scan lines SL1_1 to SL1_$m$, second scan lines SL2_1 to SL2_$m$+1, emission control lines EML_1 to EML_m, and data lines DL_1 to DL_n. Pixels PX are connected to power lines PL_1 to PL_n, first voltage lines VL1_1 to VL1_$m$, and second voltage lines VL2_1 to VL2_$m$. As an example, as shown in FIG. 1, a pixel $PX_{ij}$ arranged on an i-th row and a j-th column may be connected to a first scan line SL1_$i$, a second scan line SL2_$i$, an emission control line EML_i, a data line DL_j, a power line PL_j, first voltage line VL1_$i$, a second voltage line VL2_$i$, and a second scan line SL2_$i$+1. The second scan line SL2_$i$+1 may be denoted by a third scan line with respect to a pixel $PX_{ij}$.

As another example, a pixel $PX_{ij}$ may be connected to one or more of the first scan line SL1_$i$, the second scan line SL2_*i*, the emission control line EML_i, the data line DL_j, the power line PL_j, the first voltage line VL1_*i*, the second voltage line VL2_*i*, and the second scan line SL2_*i*+1. As an example, a pixel PX$_{ij}$ may be connected to the first scan line SL1_*i*, the data line DL_j, and the power line PL_j.

The data lines DL__1 to DL__n and the power lines PL__1 to PL_n may extend in a first direction DR1 and be connected to pixels PX on the same column. The first scan lines SL1_1 to SL1_*m*, the second scan lines SL2_1 to SL2_*m*+1, the emission control lines EML_1 to EML_m, the first voltage lines VL1_1 to VL1_*m*, and the second voltage lines VL2_1 to VL2_*m* may extend in a second direction DR2 and be connected to pixels PX on the same row.

Each of the first scan lines SL1_1 to SL1_*m* is configured to transfer first scan signals GW__1 to GW__m output from the gate driver 120 to pixels PX on the same row. Each of the second scan lines SL2__1 to SL2__m is configured to transfer second scan signals GI__1 to GI__m output from the gate driver 120 to pixels PX on the same row. Each of the second scan lines SL2__2 to SL2_*m*+1 is configured to transfer third scan signals GB__1 to GB__m output from the gate driver 120 to pixels PX on the same row. A second scan signal GI__i and a third scan signal GB_*i*−1 may be the same signal transferred through the second scan line SL2_*i*.

Each of the emission control lines EML_1 to EML_m is configured to transfer emission control signals EM__1 to EM__m output from the gate driver 120 to pixels PX on the same row. Each of the data lines DL__1 to DL__n is configured to transfer data voltages Dm__1 to Dm__n output from the data driver 130 to pixels PX on the same column. A pixel PX$_{ij}$ arranged on an i-th row and a j-th column is configured to receive first to third scan signals GW_i, GI_i, and GB_i, a data voltage Dm_j, and an emission control signal EM_i.

Each of the power lines PL__1 to PL__n is configured to transfer a first driving voltage ELVDD output from the voltage generator 150 to pixels PX on the same column. Each of the first voltage lines VL1_1 to VL1_*m* is configured to transfer a first initialization voltage VINT1 output from the voltage generator 150 to pixels PX on the same row. Each of second voltage lines VL2_1 to VL2_*m* is configured to transfer a second initialization voltage VINT2 output from the voltage generator 150 to pixels PX on the same row.

As another example, the first driving voltage ELVDD may be transferred to pixels PX on the same row through power lines extending in the second direction. As another example, the first initialization voltage VINT1 may be transferred to pixels PX on the same column through the first voltage lines extending in the first direction. As another example, the second initialization voltage VINT2 may be transferred to pixels PX on the same column through the second voltage lines extending in the first direction.

A pixel PX$_{ij}$ includes a light-emitting element and a driving thin-film transistor, the driving thin-film transistor being configured to control the magnitude of a current flowing through the light-emitting element based on a data voltage Dm_j. The data voltage Dm__j is output from the data driver 130 and received by a pixel PX$_{ij}$ through the data line DL_j. A light-emitting element may be, for example, an organic light-emitting diode (OLED). Because the light-emitting element emits light corresponding to the magnitude of a current received from the driving thin-film transistor, a pixel PX$_{ij}$ may express a grayscale corresponding to a data voltage Dm_j. A pixel PX may correspond to a portion of a unit pixel that may display full colors, for example, a sub-pixel. A pixel PX$_{ij}$ may further include at least one switching thin-film transistor and at least one capacitor. A pixel PX$_{ij}$ is described below in more detail.

The voltage generator 150 may generate voltages required for driving a pixel PX$_{ij}$. As an example, the voltage generator 150 may be configured to generate the first driving voltage ELVDD, a second driving voltage ELVSS, the first initialization voltage VINT1, and the second initialization voltage VINT2. A level of the first driving voltage ELVDD may be greater than a level of the second driving voltage ELVSS. A level of the second initialization voltage VINT2 may be greater than a level of the first initialization voltage VINT1. A level of the second initialization voltage VINT2 may be greater than a level of the second driving voltage ELVSS. A difference between the second initialization voltage VINT2 and the second driving voltage ELVSS may be less than a threshold voltage required for a light-emitting element of a pixel PX to emit light.

The voltage generator 150 may generate a first gate voltage VGH and a second gate voltage VGL for controlling a switching thin-film transistor of a pixel PX$_{ij}$ and provide the same to the gate driver 120. When the first gate voltage VGH is applied to a gate of the switching thin-film transistor, the switching thin-film transistor is turned off, and when the second gate voltage VGL is applied to the gate of the switching thin-film transistor, the switching thin-film transistor may be turned on. The first gate voltage VGH may be denoted by a turn-off voltage, and the second gate voltage VGL may be denoted by a turn-on voltage. Switching thin-film transistors of a pixel PX$_{ij}$ may be p-type metal oxide semiconductor field effect transistors (MOSFET), and a level of the first gate voltage VGH may be greater than a level of the second gate voltage VGL. The voltage generator 150 may generate gamma reference voltages and provide the same to the data driver 130.

A timing controller 140 may control the display unit 110 by controlling the timing of the gate driver 120 and the data driver 130. Pixels PX of the display unit 110 may display an image corresponding to image source data RGB of one frame by receiving a new data voltage Dm every frame and emitting light corresponding to the data voltage Dm.

In an embodiment, one frame period may include a gate initialization period, a data writing and anode initializing period, and a light-emitting period. During an initialization period, the first initialization voltage VINT1 may be applied to pixels PX in synchronization with a second scan signal GI. During a data wiring and anode initializing period, the data voltage Dm may be applied to pixels PX in synchronization with a first scan signal GW, and the second initialization voltage VINT2 may be applied to pixels PX in synchronization with a third scan signal GB. During an emission period, pixels PX of the display unit 110 emit light.

The timing controller 140 is configured to receive image source data RGB and a control signal CONT from the outside. The timing controller 140 may be configured to convert image source data RGB into image data DATA based on the characteristics of the display unit 110 and pixels PX. The timing controller 140 may be configured to provide image data DATA to the data driver 130.

The control signal CONT may include a vertical synchronization signal Vsync, a horizontal synchronization signal Hsync, a data enable signal DE, and a clock signal CLK. The timing controller 140 may control an operation timing of the gate driver 120 and the data driver 130 by using the control signal CONT. The timing controller 140 may determine a frame period by counting a data enable signal DE of a horizontal scanning period. In this case, a vertical synchronization signal Vsync and a horizontal synchronization signal Hsync supplied from the outside may be omitted. The image source data RGB includes luminance information of pixels PX. Brightness may have a predetermined number of grayscales, for example, 1024 (=$2^{10}$), 256 (=$2^8$), or 64 (=$2^6$).

The timing controller 140 may generate control signals including a gate timing control signal GDC for controlling an operation timing of the gate driver 120, and a data timing control signal DDC for controlling an operation timing of the data driver 130.

The gate timing control signal GDC may include a gate start pulse (GSP), a gate shift clock (GSC), and a gate output enable (GOE) signal. The GSP is supplied to the gate driver 120 that generates a first scan signal at a start point of a scanning period. The GSC is a clock signal input to the gate driver 120 in common and is a clock signal for shifting the GSP. The GOE signal is configured to control an output of the gate driver 120.

The data timing control signal DDC may include a source start pulse (SSP), a source sampling clock (SSC), and a source output enable (SOE) signal. The SSP controls a data sampling start point of the data driver 130 and is provided to the data driver 130 at a start point of a scanning period. The SSC is a clock signal that controls a sampling operation of data inside the data driver 130 based on a rising edge or a falling edge of the clock signal. The SOE signal is configured to control an output of the data driver 130. The SSP supplied to the data driver 130 may be omitted depending on a data transmission method.

The gate driver 120 is configured to sequentially generate first scan signals GW__1 to GW_m, second scan signals GI__1 to GI_m, and third scan signals GB__1 to GB__m in response to a gate timing control signal GDC supplied from the timing controller 140 by using the first and second gate voltages VGH and VGL provided from the voltage generator 150.

The data driver 130 samples and latches image data DATA to convert the same into data of a parallel data system in response to a data timing control signal DDC supplied from the timing controller 140, the image data DATA being supplied from the timing controller 140. When converting image data into data of a parallel data system, the data driver 130 converts the image data DATA to a gamma reference voltage, thereby converting the image data DATA to a data voltage having an analog form. The data driver 130 provides data voltages Dm__1 to Dm_n to pixels PX through data lines DL__1 to DL_n. Pixels PX receive data voltages Dm__1 to Dm_n in response to first scan signals GW__1 to GW_m.

Figure 2:
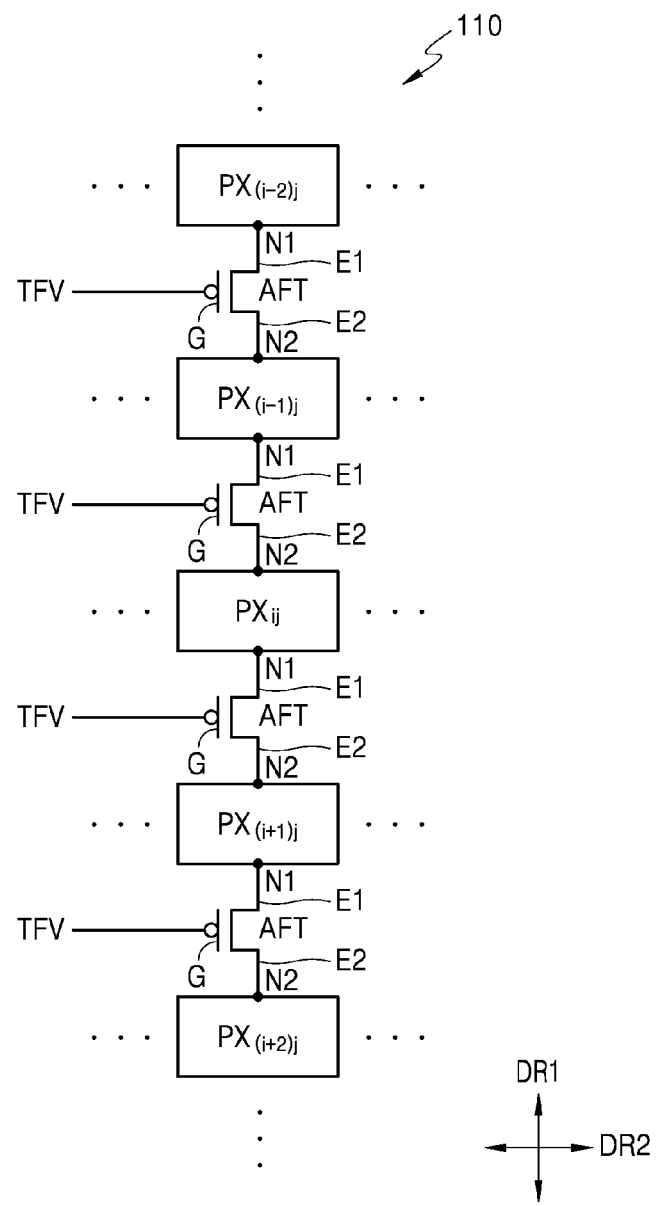
FIG. 2 is a view of a plurality of pixels and a plurality of always-off thin-film transistors according to an embodiment.

FIG. 2 is a view of a plurality of pixels and a plurality of always-off thin-film transistors AFT according to an embodiment.

Referring to FIG. 2, the display unit 110 of the organic light-emitting display apparatus includes pixels PX such as a pixel PXij arranged on an i-th row and a j-th column. The pixels PX may be arranged in the first direction DR1 and the second direction DR2 that is substantially orthogonal to the first direction DR1. As an example, the pixels PX may be arranged in a matrix configuration.

In an embodiment, a plurality of always-off thin-film transistors AFT may be alternately arranged between pixels PX arranged in the first direction DR1. Pixels PX on the same column may be physically connected to each other through the plurality of always-off thin-film transistors AFT. As an example, as shown in FIG. 2, a plurality of always-off thin-film transistors AFT may be alternately arranged between pixels PX arranged on a j-th column.

The pixels PX may each include a first node N1 and a second node N2. In this case, the first node N1 may be a node to which the first driving voltage ELVDD (see FIG. 1) is applied. The second node N2 may be a node to which the first initialization voltage VINT1 (see FIG. 1) is selectively applied, or a node to which the first initialization voltage VINT1 is always applied. This is described below in more detail.

The plurality of always-off thin-film transistors AFT may each be arranged between two pixels PX neighboring each other from among pixels PX. The plurality of always-off thin-film transistors AFT may each may connect one first node N1 of one of two pixels PX neighboring each other to the second node N2 of the other.

As an example, a pixel PX(i−2)j on a (i−2)-th row and a j-th column, a pixel PX(i−1)j on a (i−1)-th row and a j-th column, a pixel PXij on an i-th row and a j-th column, a pixel PX(i+1)j on a (i+1)-th row and a j-th column, and a pixel PX(i+2)j on a (i+2)-th row and a j-th column may be arranged in the first direction DR1. The pixel PX(i−2)j, the pixel PX(i−1)j, the pixel PXij, the pixel PX(i+1)j, and the pixel PX(i+2)j may each include the first node N1 and the second node N2.

The plurality of always-off thin-film transistors AFT may be alternately arranged between the pixel PX(i−2)j, the pixel PX(i−1)j, the pixel PXij, the pixel PX(i+1)j, and the pixel PX(i+2)j. One of the plurality of always-off thin-film transistors AFT may be arranged between the pixel PX(i−2)j and the pixel PX(i−1)j. Another of the plurality of always-off thin-film transistors AFT may be arranged between the pixel PX(i−1)j and the pixel PXij. Another of the plurality of always-off thin-film transistors AFT may be arranged between the pixel PXij and the pixel PX(i+1)j. Another of the plurality of always-off thin-film transistors AFT may be arranged between the pixel PX(i+1)j and the pixel PX(i+2)j.

As shown in FIG. 2, the first node N1 of the pixel PX(i−2)j is connected to the second node N2 of the pixel PX(i−1)j through an always-off thin-film transistor AFT. The first node N1 of the pixel PX(i−1)j is connected to the second node N2 of the pixel PXij through an always-off thin-film transistor AFT. The first node N1 of the pixel PXij is connected to the second node N2 of the pixel PX(i+1)j through an always-off thin-film transistor AFT. The first node N1 of the pixel PX(i+1)j is connected to the second node N2 of the pixel PX(i+2)j through an always-off thin-film transistor AFT.

In an embodiment, the always-off thin-film transistor AFT may include a first electrode E1, a second electrode E2, and a gate electrode G, the first electrode E1 being connected to the first node N1, and the second electrode E2 being connected to the second node N2. A turn-off voltage TFV may be applied to the gate electrode G of the always-off thin-film transistor AFT. As a turn-off voltage TFV is applied to the gate electrode G, the always-off thin-film transistor AFT may be always turned off. Here, 'always' may denote the always-off thin-film transistor AFT is turned off while the organic light-emitting display apparatus is turned on. While the organic light-emitting display apparatus operates, the first electrode E1 of the always-off thin-film transistor AFT may be electrically insulated from the second electrode E2.

Because the always-off thin-film transistor AFT may be always turned off, the always-off thin-film transistor AFT may physically connect pixels PX neighboring each other but electrically insulate the neighboring pixels PX from each other. As an example, the always-off thin-film transistor AFT may physically connect the first node N1 of one of two pixels PX adjacent to each other to the second node N2 of the other, but electrically insulate the first node N1 of one of two pixels PX adjacent to each other from the second node N2 of the other.

Though it is shown in FIG. 2 that the always-off thin-film transistor AFT includes one thin-film transistor, the always-off thin-film transistor AFT may include at least two thin-film transistors connected to each other in series. A turn-off voltage may be applied, in common, to gates of the at least two thin-film transistors connected to each other in series. In the case where the always-off thin-film transistor AFT connected between the first node N1 and the second node N2 includes a plurality of thin-film transistors connected to each other in series, an amount of a leakage current flowing through the always-off thin-film transistor AFT between the first node N1 and the second node N2 may be reduced even more, and voltages having high potential differences may be respectively applied to the first node N1 and the second node N2. As an example, the first driving voltage ELVDD may be applied to the first node N1, and the first initialization voltage VINT1 may be applied to the second node N2. Even in this case, the first node N1 may be electrically and sufficiently insulated from the second node N2.

Figure 3:
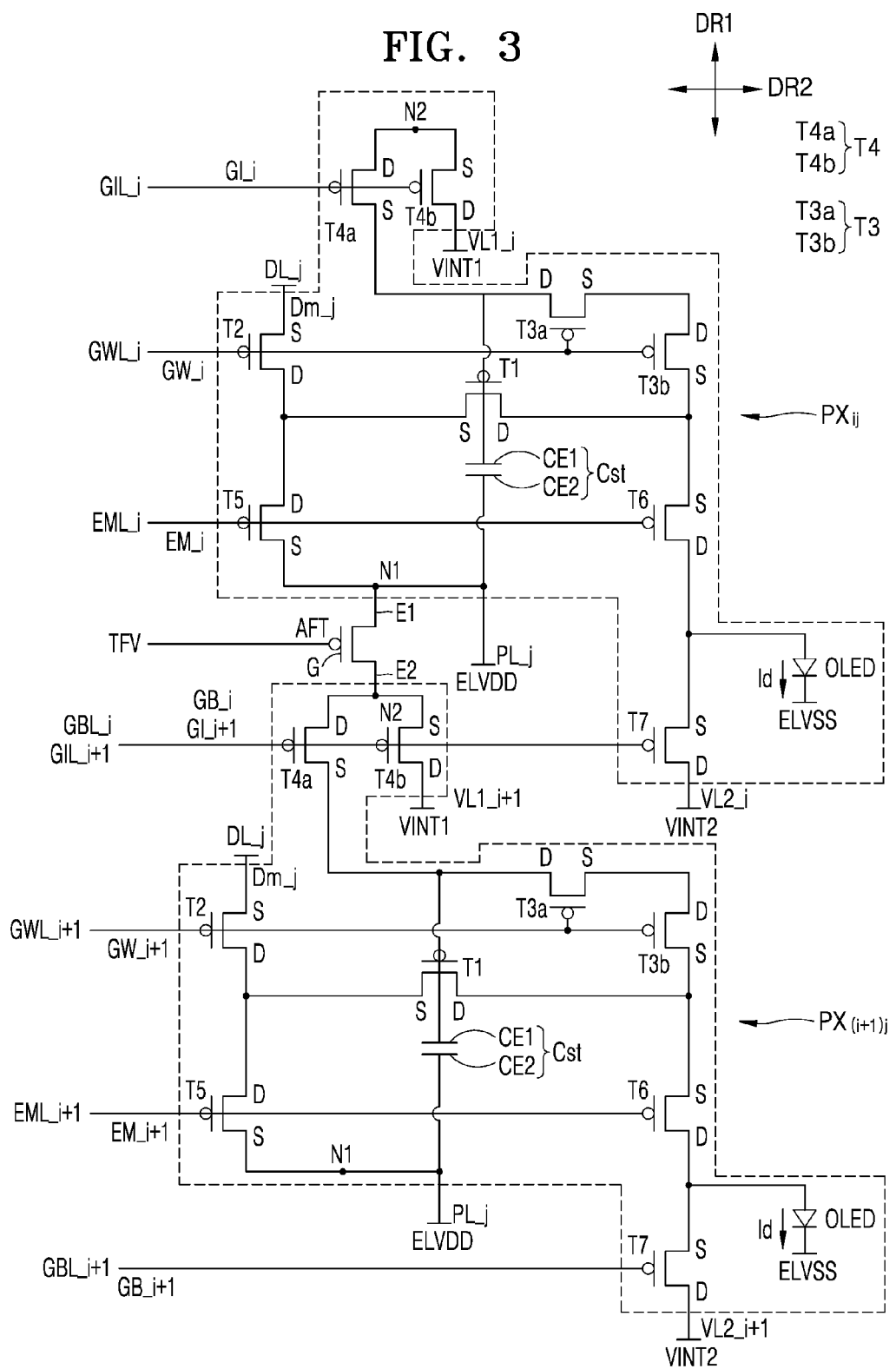
FIG. 3 is an equivalent circuit diagram of each of a plurality of pixels according to an embodiment.

FIG. 3 is an equivalent circuit diagram of each of a plurality of pixels according to an embodiment.

FIG. 3 shows a pixel PXij on an i-th row and a j-th column (hereinafter, referred to as a first pixel), and a pixel PX(i+1)j on a (i+1)-th row and a j-th column (hereinafter, referred to as a second pixel). The first pixel PXij and the second pixel PX(i+1)j are adjacent to each other and are arranged on the same column and may be connected to the same data line DL_j.

In an embodiment, an always-off thin-film transistor AFT may be arranged between the first pixel PXij and the second pixel PX(i+1)j arranged in the first direction DR1 The first pixel PXij and the second pixel PX(i+1)j may each include the first node N1 and the second node N2. In this case, the first node N1 may be a node to which the first driving voltage ELVDD is applied. The second node N2 may be a node to which the first initialization voltage VINT1 is selectively applied.

In an embodiment, the always-off thin-film transistor AFT may include a first electrode E1, a second node N2, a second electrode E2, and a gate electrode G, the first electrode E1 being connected to the first node N1, and the second electrode E2 being connected to the second node N2. A turn-off voltage TFV may be applied to the gate electrode G of the always-off thin-film transistor AFT. As a turn-off voltage TFV is applied to the gate electrode G, the always-off thin-film transistor AFT may be always turned off.

The always-off thin-film transistor AFT may connect the first node N1 of the first pixel PXij to the second node N2 of the second pixel PX(i+1)j. Because the always-off thin-film transistor AFT may be always turned off, the always-off thin-film transistor AFT may physically connect the first node N1 of the first pixel PXij to the second node N2 of the second pixel PX(i+1)j. The always-off thin-film transistor AFT physically connects the first pixel PXij to the second pixel PX(i+1)j, but the first pixel PXij may be electrically insulated from the second pixel PX(i+1)j by the always-off thin-film transistor AFT.

Though it is shown in FIG. 3 that the always-off thin-film transistor AFT includes one thin-film transistor, the always-off thin-film transistor AFT may include at least two thin-film transistors connected to each other in series.

Referring to FIG. 3, the first pixel PXij is connected to first to third scan lines GWL_i, GIL_i, and GBL_i, a data line DL_j, an emission control line EML_i, the first to third scan lines GWL_i, GIL_i, and GBL_i respectively transferring first to third scan signals GW GI_i, and GB_i, the data line DL__j transferring a data voltage Dm_j, and the emission control line EML_i transferring an emission control signal EM_i. The first pixel PXij is connected to a power line PL_j, a first voltage line VL1_i, and a second voltage line VL2_i, the power line PL__j transferring the first driving voltage ELVDD, the first voltage line VL1_i transferring the first initialization voltage VINT1, and the second voltage line VL2_i transferring the second initialization voltage VINT2. The first pixel PXij is connected to a common electrode to which the second driving voltage ELVSS is applied. The first pixel PXij may correspond to the first pixel PXij of FIG. 1.

The first scan line GWL_i corresponds to the first scan line SL1_i of FIG. 1, the second scan line GIL_i corresponds to the second scan line SL2_i of FIG. 1, and the third scan line GBL_i corresponds to the second scan line SL2_i+1 of FIG. 1.

The second pixel PX(i+1)j is connected to first to third scan lines GWL_i+1, GIL_i+1, and GBL_i+1, a data line DL_j, and an emission control line EML_i+1, the first to third scan lines GWL_i+1, GIL_i+1, and GBL_i+1 respectively transferring first to third scan signals GW_i+1, GI_i+1, and GB_i+1, the data line DL_j transferring a data voltage Dm_j, and the emission control line EML_i+1 transferring an emission control signal EM_i+1. The second pixel PX(i+1)j is connected to the power line PL_j, a first voltage line VL1_i+1, and a second voltage line VL2_i+1, the power line PL_j transferring the first driving voltage ELVDD, the first voltage line VL1_i+1 transferring the first initialization voltage VINT1, and the second voltage line VL2_i+1 transferring the second initialization voltage VINT2. The second pixel PX(i+1)j is connected to the common electrode to which the second driving voltage ELVSS is applied. The second scan line GIL_i+1 corresponds to the second scan line SL2_i+1 of FIG. 1. The second scan line GIL_i+1 may be denoted by a third scan line GBL__i with respect to the first pixel PXij.

Hereinafter, description is made to elements included in the first pixel PXij and the second pixel PX(i+1)j. Because an equivalent circuit diagram of the first pixel PXij is equally applicable to the second pixel PX(i+1)j, description is made to the first pixel PXij as a reference.

The first pixel PXij includes a light-emitting diode OLED, first to seventh thin-film transistors T1, T2, T3, T4, T5, T6, and T7, and a storage capacitor Cst. The light-emitting diode OLED may be an organic light-emitting diode having an anode and a cathode. The cathode may be a common electrode to which the second driving voltage ELVSS is applied.

The first thin-film transistor T1 may be a driving transistor in which the magnitude of a drain current is determined according to a gate-source voltage, and the second to seventh thin-film transistors T2, T3, T4, T5, T6, and T7 may be switching transistors that are turned on/off according to a gate-source voltage, substantially a gate voltage. The third thin-film transistor T3 includes a first compensation thin-film transistor T3a and a second compensation thin-film transistor T3b connected to each other in series. The fourth thin-film transistor T4 includes a first gate initialization thin-film transistor T4a and a second gate initialization thin-film transistor T4b connected to each other in series.

The first thin-film transistor T1 may be denoted by a driving thin-film transistor, the second thin-film transistor T2 may be denoted by a scan thin-film transistor, the third thin-film transistor T3 may be denoted by a compensation thin-film transistor, the fourth thin-film transistor T4 may be denoted by a gate initialization thin-film transistor, the fifth thin-film transistor T5 may be denoted by a first emission control thin-film transistor, the sixth thin-film transistor T6 may be denoted by a second emission control thin-film transistor, and the seventh thin-film transistor T7 may be denoted by an anode initialization thin-film transistor.

The storage capacitor Cst is connected between the power line PL__j and a gate of the driving thin-film transistor T1. The storage capacitor Cst may include a top electrode CE2 and a bottom electrode CE1, the top electrode CE2 being connected to the power line PL_j, and the bottom electrode CE1 being connected to the gate of the driving thin-film transistor T1.

The driving thin-film transistor T1 may control the magnitude of a current Id flowing to the light-emitting element OLED from the power line PL_j. The driving thin-film transistor T1 may include the gate, a source, and a drain, the gate being connected to the bottom electrode CE1 of the storage capacitor Cst, the source being connected to the power line PL__j through the first emission control thin-film transistor T5, and the drain being connected to the light-emitting element OLED through the second emission control thin-film transistor T6.

The driving thin-film transistor T1 may output the driving current Id to the light-emitting element OLED according to a gate-source voltage. The magnitude of the driving current Id is determined based on a difference between the gate-source voltage of the driving thin-film transistor T1 and the threshold voltage. The light-emitting element OLED may receive the driving current Id from the driving thin-film transistor T1 and emit light at brightness corresponding to the magnitude of the driving current Id.

The scan thin-film transistor T2 is configured to transfer a data voltage Dm__j to the source of the driving thin-film transistor T1 in response to a first scan signal GW_i. The scan thin-film transistor T2 may include a gate, a source, and a drain, the gate being connected to the first scan line GWL_i, the source being connected to the data line GL_j, and the drain being connected to the source of the driving thin-film transistor T1.

The first and second compensation thin-film transistors T3$a$ and T3$b$ are connected between the drain and the gate of the driving thin-film transistor T1, and connect the drain to the gate of the driving thin-film transistor T1 in response to a first scan signal GW_i. The first compensation thin-film transistor T3$a$ may include a gate, a source, and a drain, the gate being connected to the first scan line GWL_i, the source being connected to the second compensation thin-film transistor T3$b$, and the drain being connected to the gate of the driving thin-film transistor T1. The second compensation thin-film transistor T3$b$ may include a gate, a source, and a drain, the gate being connected to the first scan line GWL_i, the source being connected to the drain of the driving thin-film transistor T1, and the drain being connected to the source of the first compensation thin-film transistor T3$a$. Though it is shown in FIG. 3 that the compensation thin-film transistor T3 includes two thin-film transistors connected to each other in series, the compensation thin-film transistor T3 may include one thin-film transistor.

The gate initialization thin-film transistor T4 applies the first initialization voltage VINT1 to the gate of the driving thin-film transistor T1 in response to a second scan signal GI_i. The gate initialization thin-film transistor T4 may include a gate, a source, and a drain, the gate being connected to the second scan line GIL_i, the source being connected to the gate of the driving thin-film transistor T1, and the drain being connected to the first voltage line VL1_$i$.

As shown in FIG. 3, the gate initialization thin-film transistor T4 may include a first gate initialization thin-film transistor T4$a$ and a second gate initialization thin-film transistor T4$b$ that are connected to each other in series between the gate of the driving thin-film transistor T1 and the first voltage line VL1_$i$. A node between the first and second gate initialization thin-film transistors T4$a$ and T4$b$ is denoted by the second node N2. The first gate initialization thin-film transistor T4$a$ may include a gate, a source, and a drain, the gate being connected to the second scan line GIL_i, the source being connected to the gate of the driving thin-film transistor T1, and the drain being connected to the second node N2. The second gate initialization thin-film transistor T4$b$ may include a gate, a source, and a drain, the gate being connected to the second scan line GIL_i, the source being connected to the second node N2, and the drain being connected to the first voltage line VL1_$i$. The second node N2 may be the source or the drain of the gate initialization thin-film transistor T4.

When the second gate initialization thin-film transistor T4$b$ is turned on in response to a second scan signal GI_i, the first initialization voltage VINT1 may be applied to the second node N2. The first initialization voltage VINT1 may be selectively applied to the second node N2.

Though it is shown in FIG. 3 that the gate initialization thin-film transistor T4 includes two thin-film transistors T4$a$, T4$b$ connected to each other in series, the gate initialization thin-film transistor T4 may include three or more thin-film transistors that are connected to each other in series. In this case, the second node N2 may be arranged between a plurality of gate initialization thin-film transistors T4. The second node N2 may be the source or the drain of the gate initialization thin-film transistor T4.

As another example, the gate initialization thin-film transistor T4 may include one thin-film transistor. This is described below in more detail.

The second node N2 of the second pixel $PX_{(i+1)j}$ may be in a floated state when the gate initialization thin-film transistor T4 is turned off in response to a second scan signal GI_i. Because the second node N2 of the second pixel $PX_{(i+1)j}$ is arranged between the always-off thin-film transistor AFT, which is always turned off, and a turned-off gate initialization thin-film transistor T4, the second node N2 of the second pixel $PX_{(i+1)j}$ may be in a floated state.

The anode thin-film transistor T7 is configured to apply the second initialization voltage VINT2 to the light-emitting element OLED in response to a third scan signal GB_i. The anode initialization thin-film transistor T7 may include a gate, a source, and a drain, the gate being connected to the third scan line GBL_i, the source being connected to an anode of the light-emitting element OLED, and the drain being connected to the second voltage VL2_$i$.

The first emission control thin-film transistor T5 may be configured to connect the power line PL__j to the source of the driving thin-film transistor T1 in response to an emission control signal EM_i. A node between the first emission control thin-film transistor T5 and the power line PL__j is denoted by the first node N1. The first emission control thin-film transistor T5 may include a gate, a source, and a drain, the gate being connected to the emission control line EML_i, the source being connected to the first node N1, and the drain being connected to the source of the driving thin-film transistor T1. Because the first node N1 is connected to the power line PL_j, the first driving voltage ELVDD may be applied to the first node. N1.

The second emission control thin-film transistor T6 may connect the drain of the driving thin-film transistor T1 to the anode of the light-emitting element OLED in response to an emission control signal EM_i. The second emission control thin-film transistor T6 may include a gate, a source, and a drain, the gate being connected to the emission control line EML_i, the source being connected to the drain of the driving thin-film transistor T1, and the drain being connected to the anode of the light-emitting element OLED.

A second scan signal GI__i may be substantially synchronized with a first scan signal GW_$i$–1 on a previous row. A third scan signal GB_i may be substantially synchronized with a first scan signal GW_i. According to another example, a third scan signal GB_i may be substantially synchronized with a first scan signal GW_$i$+1 on the next row.

Hereinafter, a specific operation process of one pixel of an organic light-emitting display apparatus according to an embodiment is described in detail.

First, when an emission control signal EM__i of a high level is received, the first emission control thin-film transistor T5 and the second emission control thin-film transistor T6 are turned off, the driving thin-film transistor T1 stops outputting the driving current Id, and the light-emitting element OLED stops emitting light.

Then, during a gate initialization period in which a second scan signal GI__i of a low level is received, the gate initialization thin-film transistor T4 is turned on, and the first initialization voltage VINT1 is applied to the gate of the driving thin-film transistor T1, that is, the bottom electrode of the storage capacitor Cst. A difference ELVDD-VINT1 between the first driving voltage ELVDD and the first initialization voltage VINT1 is stored in the storage capacitor Cst.

Then, during a data-write period in which a first scan signal GW__i of a low level is received, the scan thin-film transistor T2 and the compensation thin-film transistor T3 are turned on, and a data voltage Dm__j is received by the source of the driving thin-film transistor T1. The driving thin-film transistor T1 is diode-connected and forward-biased by the compensation thin-film transistor T3. The gate voltage of the driving thin-film transistor T1 is raised from the first initialization voltage VINT1. When the gate voltage of the driving thin-film transistor T1 becomes a data compensation voltage Dm__j–|Vth| which is reduced by a threshold voltage Vth of the driving thin-film transistor T1 from the data voltage Dm_j, the driving thin-film transistor T1 is turned off and the rise of the gate voltage of the driving thin-film transistor stops. Accordingly, a difference ELVDD_Dm__j+|Vth| between the first driving voltage ELVDD and the data compensation voltage Dm__j–|Vth| is stored in the storage capacitor Cst.

In addition, during an anode initialization period in which a third scan signal GB_i of a low level is received, the anode initialization thin-film transistor T7 is turned on and the second initialization voltage VINT2 is applied to the anode of the light-emitting element OLED. Because the light-emitting element OLED is not emitted completely by applying the second initialization voltage VINT2 to the anode of the light-emitting element OLED, a phenomenon that the light-emitting element OLED finely emits light to correspond to a black grayscale during the next frame may be removed.

A level of the second initialization voltage VINT2 may be greater than a level of the first initialization voltage VINT1, and lower than a voltage level that is greater by a threshold voltage of the light-emitting element OLED from the second driving voltage ELVSS. Because the light-emitting element OLED has a relatively large size, the light-emitting element OLED has a considerably large capacitance. Furthermore, because a level of the first initialization voltage VINT1 is too low, the light-emitting element OLED starts to emit light after a considerable delay time in the next frame. In contrast, according to the present embodiment, the anode of the light-emitting element OLED is initialized by using the second initialization voltage VINT2 having a level greater than a level of the first initialization voltage VINT1, and thus, the light-emitting element OLED may start to emit light within a fast time in the next frame. That is, a light-emission delay issue may be resolved.

A first scan signal GW__i may be synchronized with a third scan signal GB_i. In this case, a data-write period may be the same period as an anode initialization period.

First, when an emission control signal EM__i of a low level is received, the first emission control thin-film transistor T5 and the second emission control thin-film transistor T6 are turned on, and the driving thin-film transistor T1 outputs the driving current Id, and the light-emitting element OLED may emit light at brightness corresponding to the magnitude of the driving current Id, the driving current Id corresponding to a voltage stored in the storage capacitor Cst, that is, a voltage ELVDD-Dm__j obtained by subtracting a threshold voltage |Vth| of the driving thin-film transistor T1 from the source-gate voltage ELVDD_Dm__j+|Vth| of the driving thin-film transistor T1.

Figure 4:
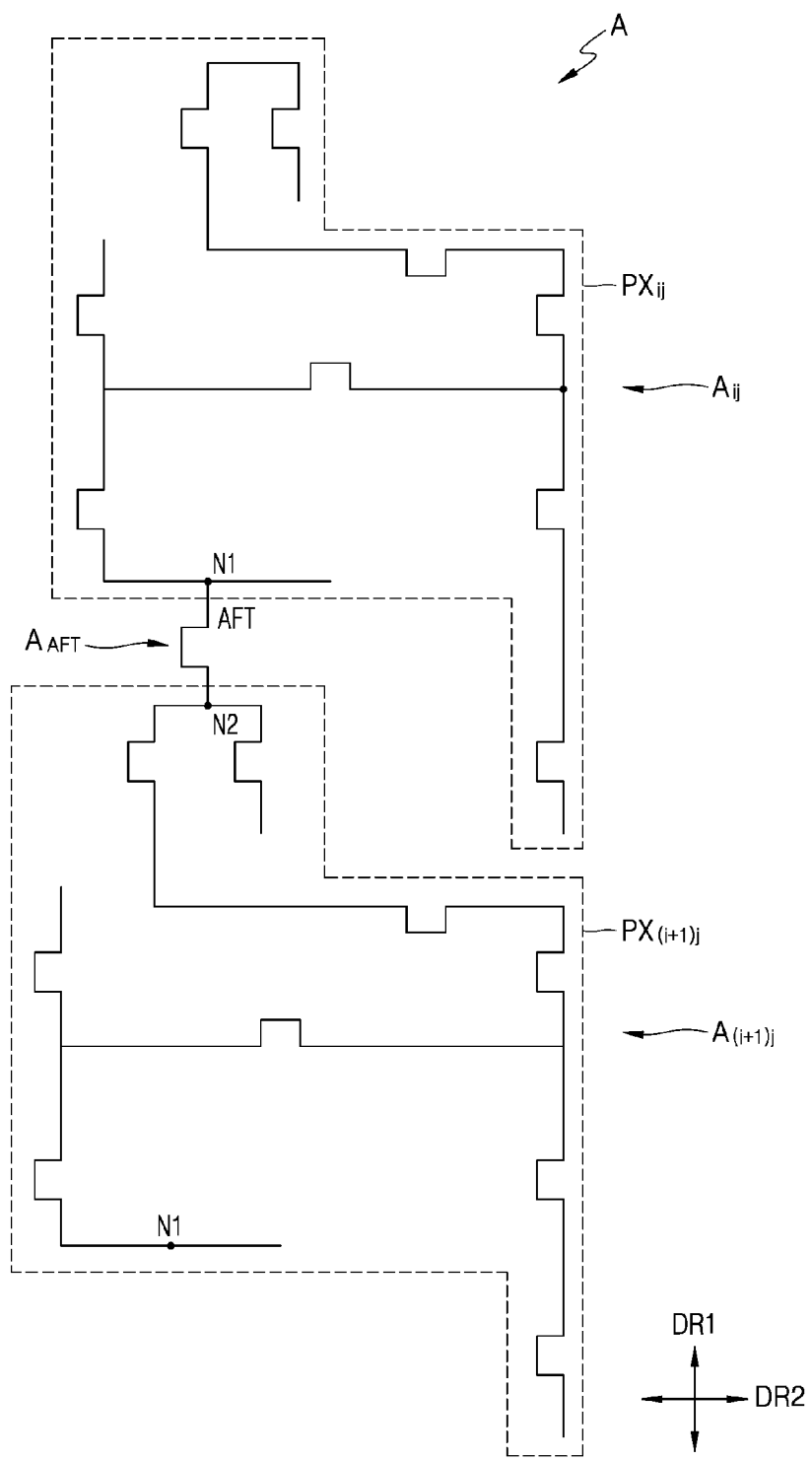
FIG. 4 is a view of a semiconductor pattern of each of a plurality of pixels according to an embodiment.

FIG. 4 is a view of a semiconductor pattern of each of a plurality of pixels according to an embodiment.

Referring to FIG. 4, the display unit 110 of the organic light-emitting display apparatus includes a semiconductor pattern A.

The semiconductor pattern A may continuously extend in the first direction DR1. The semiconductor pattern A may extend without disconnection in the first direction DR1 to be formed as one body. Though the semiconductor pattern A shown in FIG. 4 partially extends in the second direction DR2, referring to FIG. 2, because the semiconductor pattern A is used for forming a row of pixels PX and an always-off thin-film transistor AFT connected therebetween, the semiconductor pattern A extends in the first direction DR1 on the whole. That is, though the semiconductor pattern A includes a portion extending in the second direction DR2, the semiconductor pattern A extends in the first direction DR1 on the whole.

The semiconductor pattern A may include a plurality of pixel areas $A_{ij}$ and $A_{(i+1)j}$, and a plurality of transistor areas $A_{AFT}$ alternately arranged between the plurality of pixel areas $A_{ij}$ and $A_{(i+1)j}$.

Each of a plurality of pixel areas $A_{ij}$ and $A_{(i+1)j}$ may be included in the plurality of pixels $PX_{ij}$ and $PX_{(i+1)j}$, and each of the plurality of transistor areas $A_{AFT}$ may be included in a plurality of always-off thin-film transistors AFT. As an example, a first pixel area $A_{ij}$ may be included in a first pixel $PX_{ij}$. A second pixel area $A_{(i+1)j}$ may be included in a second pixel $PX_{(i-1)j}$. The transistor area $A_{AFT}$ may be included in the always-off thin-film transistor AFT.

The transistor area $A_{AFT}$ may physically connect the first node N1 of the first pixel area $A_{ij}$ to the second node N2 of the second pixel area $A_{(i+1)j}$.

As a comparative example, the semiconductor pattern may not continuously extend in a first direction and may have an island shape. Semiconductor patterns included in the plurality of pixels may not be connected to each other. After the semiconductor pattern is formed, electrostatic discharge may occur from the outside due to a process of performing a subsequent process. In the case where the semiconductor patterns are not connected to each other, electrostatic discharge that occurs may be isolated inside the semiconductor pattern. Accordingly, the semiconductor pattern influenced by electrostatic discharge is damaged, and the damaged semiconductor pattern causes a defective pixel.

However, according to an embodiment, in the case where the semiconductor pattern A continuously extends in the first direction DR1, electrostatic discharge that occurs from the outside may be distributed in the first direction DR1 without being isolated. Accordingly, because electrostatic discharge may be distributed in the first direction DR1 inside the semiconductor pattern A, damage to the semiconductor pattern A may be prevented.

Figure 5:
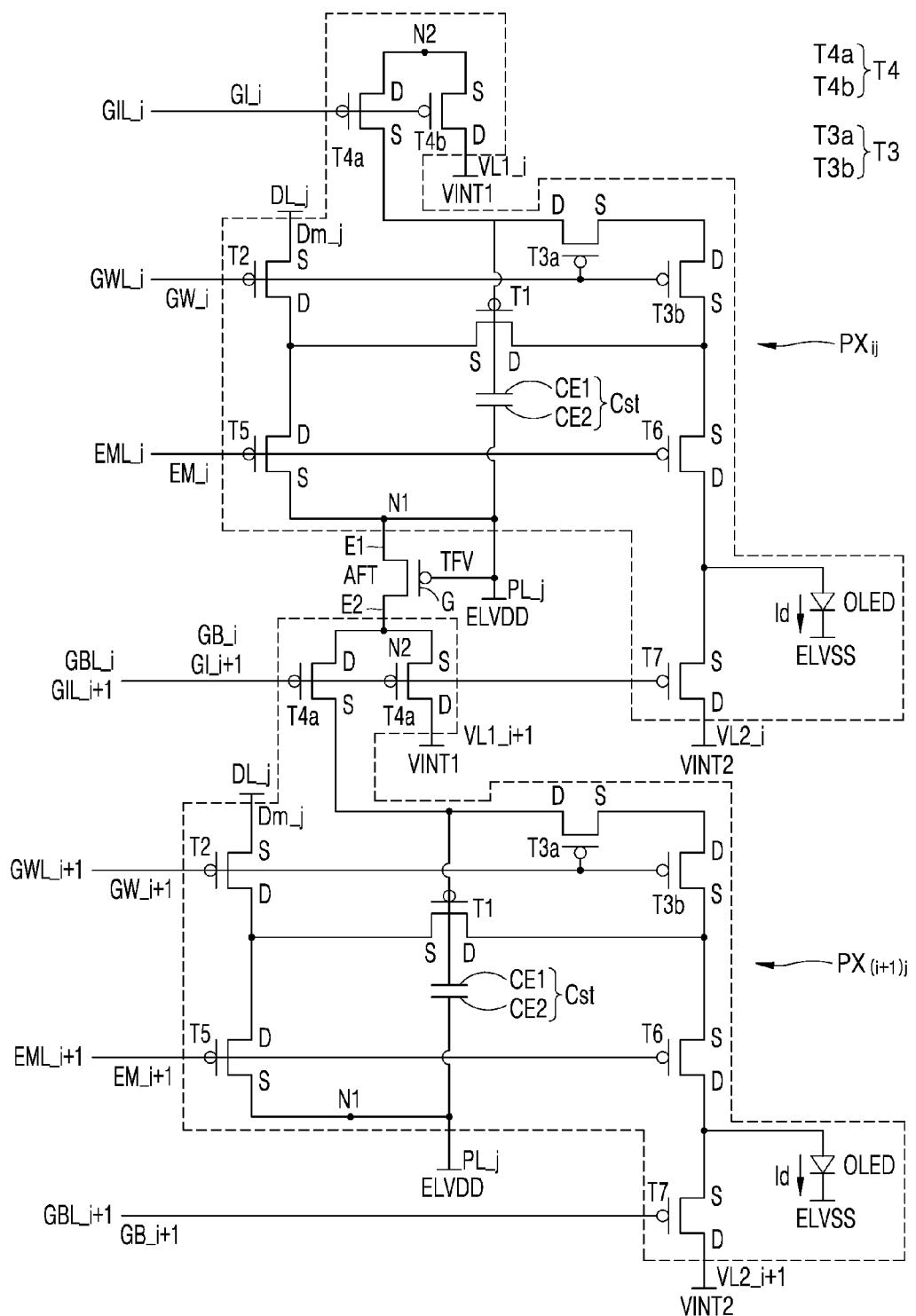
FIG. 5 is an equivalent circuit diagram of each of a plurality of pixels according to another embodiment.

FIG. 5 is an equivalent circuit diagram of each of a plurality of pixels according to another embodiment. In FIG. 5, the same reference numerals as those of FIG. 3 denote the same members, and thus, repeated descriptions thereof are omitted.

Referring to FIG. 5, an always-off thin-film transistor AFT may be arranged between the first pixel $PX_{ij}$ and the second pixel $PX_{(i-1)j}$ arranged in the first direction DR1. Each of the first pixel $PX_{ij}$ and the second pixel $PX_{(i+1)j}$ may include the first node N1 and the second node N2. In this case, the first driving voltage ELVDD may be applied to the first node N1. The first initialization voltage VINT1 may be selectively applied to the second node N2.

The always-off thin-film transistor AFT may include a first electrode E1, a second electrode E2, and a gate electrode G, the first electrode E1 being connected to the first node N1, and the second electrode E2 being connected to the second node N2. The first driving voltage ELVDD as a turn-off voltage TFV may be applied to the gate electrode G of the always-off thin-film transistor AFT. When the first driving voltage ELVDD is applied to the gate electrode G, the always-off thin-film transistor AFT is turned off.

In an embodiment, the gate electrode G of the always-off thin-film transistor AFT may be connected to the first electrode E1. The first electrode E1 is connected to the power line PL_j, and the first driving voltage ELVDD may be applied to the first electrode E1 and the gate electrode G in common.

Because the always-off thin-film transistor AFT may be always turned off, the first pixel $PX_{ij}$ is physically connected to the second pixel $PX_{(i+1)j}$ by the always-off thin-film transistor AFT, but the first pixel $PX_{ij}$ may be electrically insulated from the second pixel $PX_{(i+1)j}$ by the always-off thin-film transistor AFT.

Figure 6:
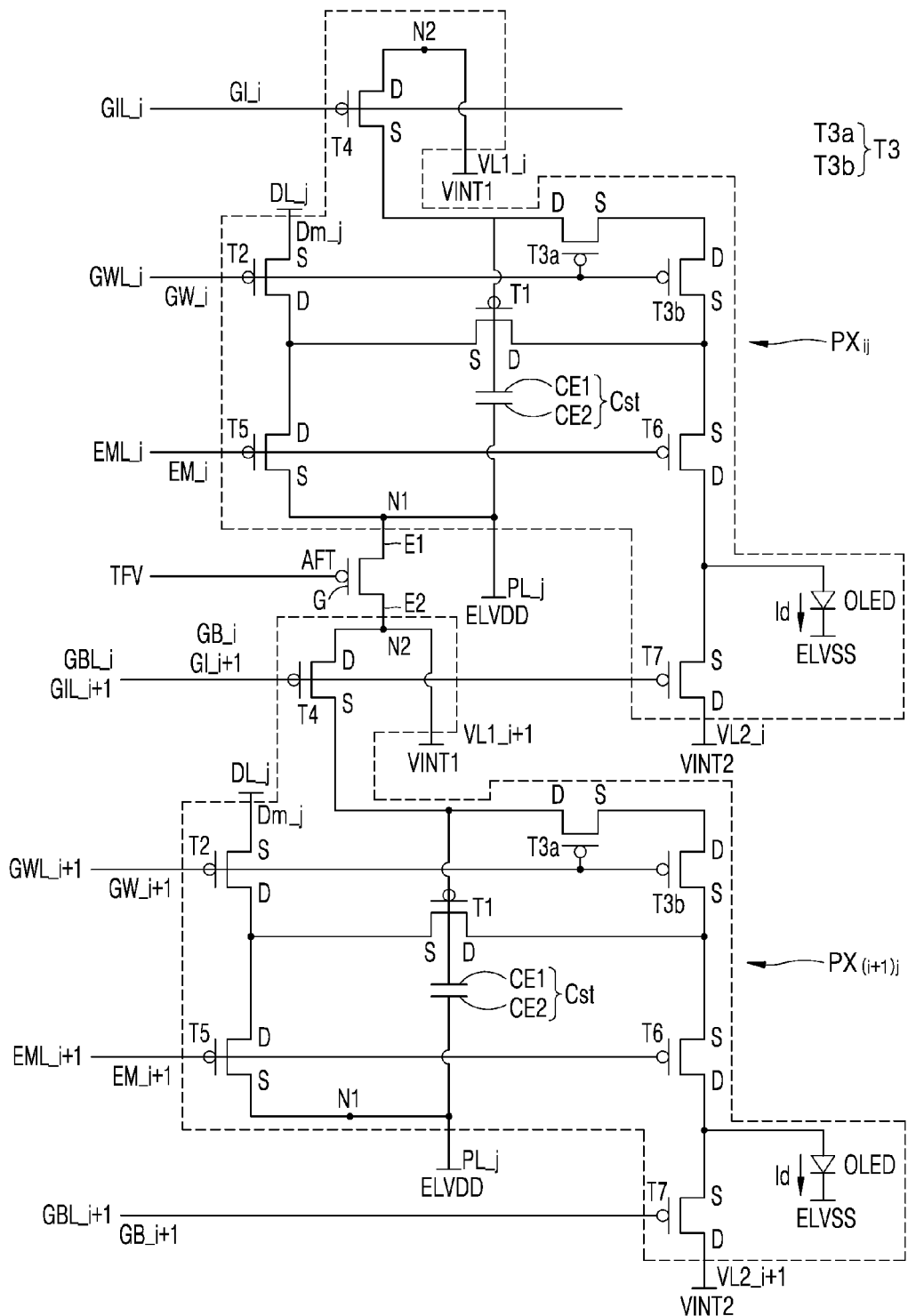
FIG. 6 is an equivalent circuit diagram of each of a plurality of pixels according to another embodiment.

FIG. 6 is an equivalent circuit diagram of each of a plurality of pixels according to another embodiment. In FIG. 6, the same reference numerals as those of FIG. 3 denote the same members, and thus, repeated descriptions thereof are omitted for ease in explanation of this figure.

Referring to FIG. 6, the gate initialization thin-film transistor T4 may include one thin-film transistor. The gate initialization thin-film transistor T4 is configured to apply the first initialization voltage VINT1 to the gate of the driving thin-film transistor T1 in response to a second scan signal GI_i. The gate initialization thin-film transistor T4 may include a gate, a source, and a drain, the gate being connected to the second scan line GIL_i, the source being connected to the gate of the driving thin-film transistor T1, and the drain being connected to the first voltage line VL1_i.

The second node N2 may be a node connected to the first voltage line VL1_i. The first initialization voltage VINT1 may be applied to the second node N2. The first initialization voltage VINT1 may be applied to the second node N2 regardless of whether the gate initialization thin-film transistor T4 is turned on/off.

Though it is shown in FIG. 6 that the always-off thin-film transistor AFT includes one thin-film transistor, the always-off thin-film transistor AFT may include at least two thin-film transistors connected to each other in series. A turn-off voltage may be applied to gates of the at least two thin-film transistors connected to each other in series.

Though description is made to the first pixel $PX_{ij}$ as a reference, the description is equally applicable to the second pixel $PX_{(i-1)j}$.

Figure 7:
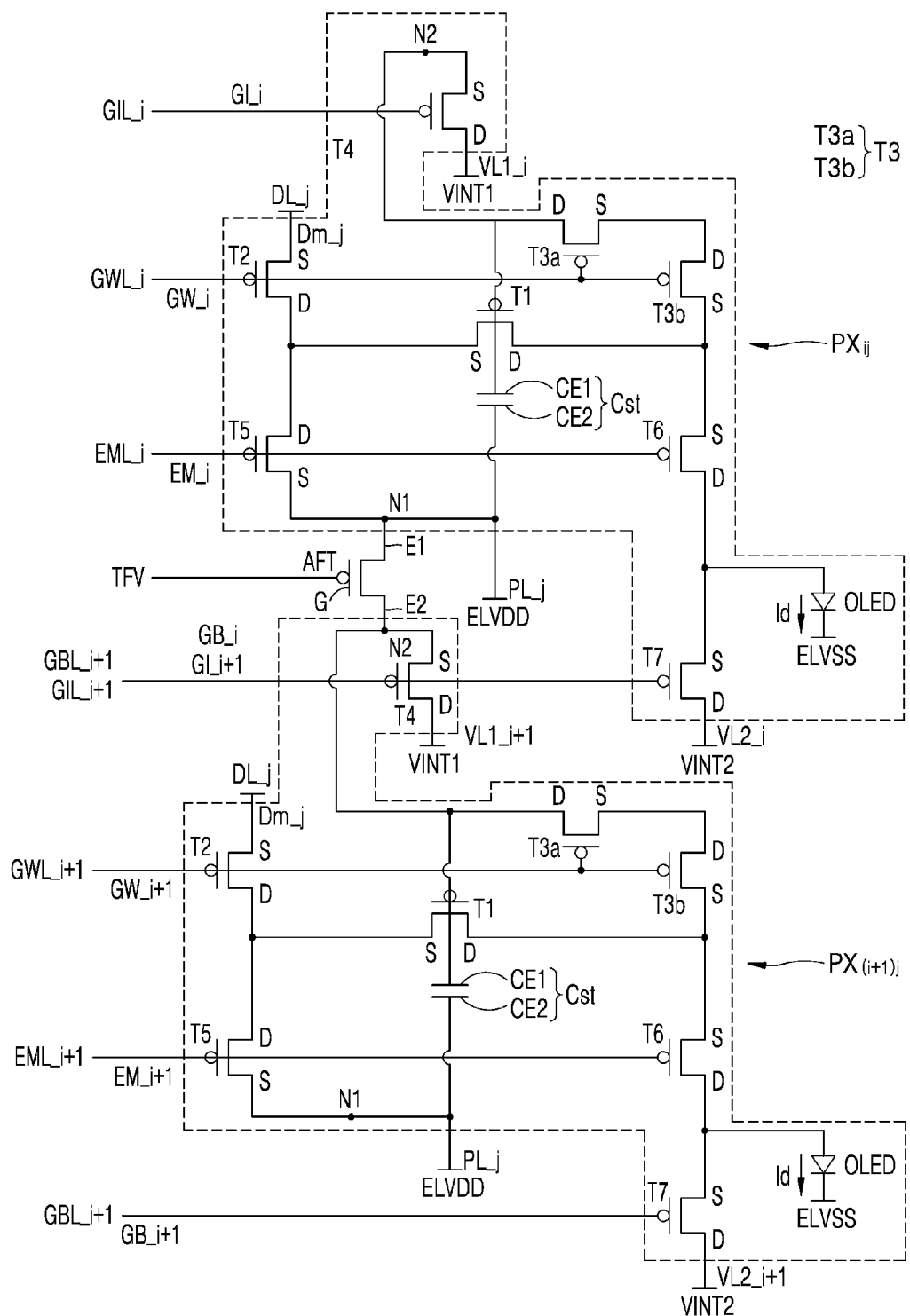
FIG. 7 is an equivalent circuit diagram of each of a plurality of pixels according to another embodiment.

FIG. 7 is an equivalent circuit diagram of each of a plurality of pixels according to another embodiment. In FIG. 7, the same reference numerals as those of FIG. 3 denote the same members, and thus, repeated descriptions thereof are omitted for ease in explanation of this figure.

Referring to FIG. 7, the gate initialization thin-film transistor T4 may include one thin-film transistor. The gate initialization thin-film transistor T4 is configured to apply the first initialization voltage VINT1 to the gate of the driving thin-film transistor T1 in response to a second scan signal GI_i. The gate initialization thin-film transistor T4 may include a gate, a source, and a drain, the gate being connected to the second scan line GIL_i, the source being connected to the gate of the driving thin-film transistor T1, and the drain being connected to the first voltage line VL1_i.

The second node N2 may be arranged between the gate initialization thin-film transistor T4 and the driving thin-film transistor T1. The second node N2 may be a source of the gate initialization thin-film transistor T4 and the gate of the driving thin-film transistor T1. When the gate initialization thin-film transistor T4 is turned on in response to a second scan signal GI_i, the first initialization voltage VINT1 may be applied to the second node N2. The first initialization voltage VINT1 may be selectively applied to the second node N2.

Though it is shown in FIG. 7 that the always-off thin-film transistor AFT includes one thin-film transistor, the always-off thin-film transistor AFT may include at least two thin-film transistors connected to each other in series. A turn-off voltage may be applied to gates of the at least two thin-film transistors connected to each other in series.

Though description is made to the first pixel $PX_{ij}$ as a reference, the description is equally applicable to the second pixel $PX_{(i+1)j}$.

Figure 8:
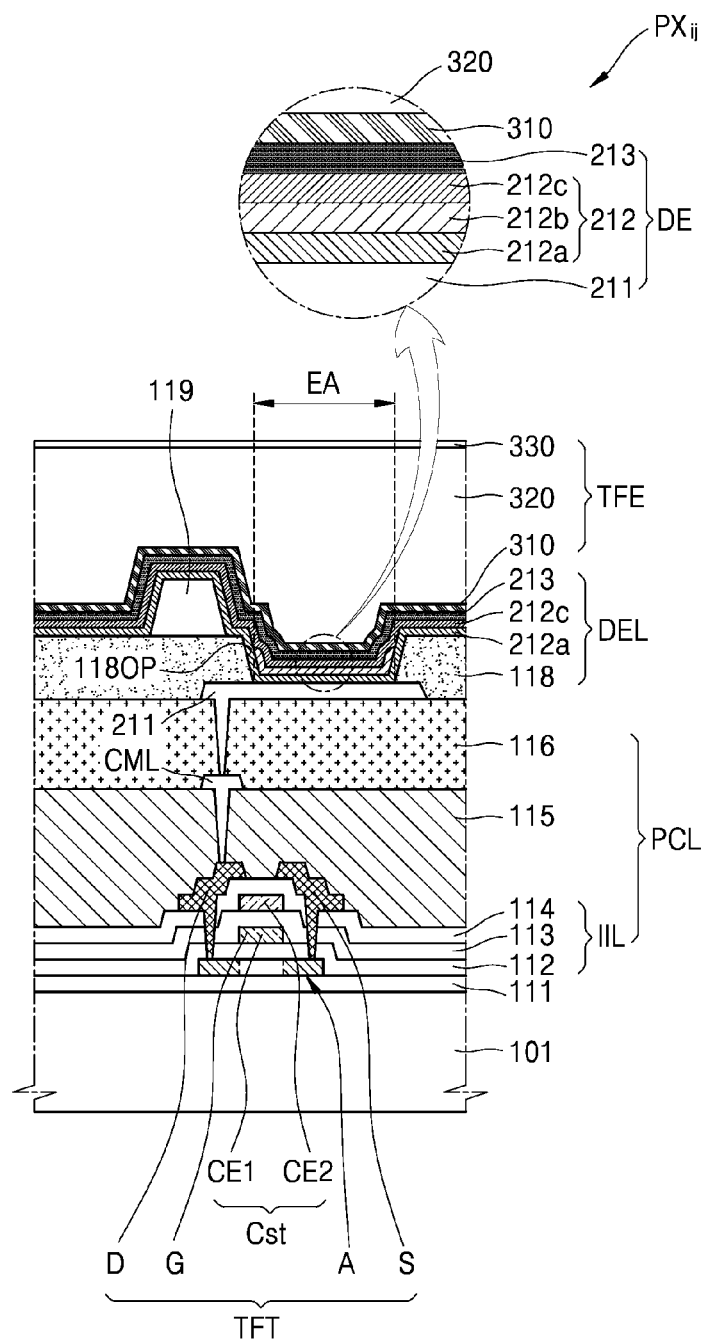
FIG. 8 is a cross-sectional view of a display apparatus according to an embodiment.

FIG. 8 is a cross-sectional view of a display apparatus according to an embodiment. In an embodiment, FIG. 8 shows a cross-section of a pixel in a display apparatus, and some members may be omitted for sake of clarity. Hereinafter, a multi-layer stacked on the display apparatus is described in detail.

Referring to FIG. 8, the display apparatus may include a substrate 101, a buffer layer 111, a pixel circuit layer PCL, a display element layer DEL, and a thin-film encapsulation layer TFE.

The substrate 101 may include glass or a polymer resin such as polyethersulfone, polyacrylate, polyetherimide, polyethylene naphthalate, polyethylene terephthalate, polyphenylene sulfide, polyimide, polycarbonate, cellulose triacetate, and cellulose acetate propionate (CAP). The substrate 101 including a polymer resin may be flexible, rollable, and bendable. The substrate 101 may have a multi-layered structure including a base layer and a barrier layer (not shown), the base layer including the polymer resin.

The buffer layer 111 may include an inorganic insulating material such as silicon nitride, silicon oxynitride, and silicon oxide and include a single layer or a multi-layer including the inorganic insulating materials.

The pixel circuit layer PCL may be arranged on the buffer layer 111. The pixel circuit layer PCL may include a thin-film transistor, inorganic insulating layers IIL, a first planarization layer 115, and a second planarization layer 116, the thin-film transistor being included in a pixel circuit, and the inorganic insulating layers IIL being arranged on/under elements of the thin-film transistor. The inorganic insulating layers IIL may include a first gate insulating layer 112, a second gate insulating layer 113, and an interlayer insulating layer 114.

The thin-film transistor may include the semiconductor layer A. The semiconductor layer A may include polycrystalline silicon. Alternatively, the semiconductor layer A may include amorphous silicon, an oxide semiconductor, or an organic semiconductor. The semiconductor layer A may include a channel region, a drain region, and a source region, the drain region and the source region being respectively arranged on two opposite sides of the channel region. The gate electrode G may overlap the channel region.

The gate electrode G may include a low-resistance metal material. The gate electrode G may include a conductive material including at least one of molybdenum (Mo), aluminum (Al), copper (Cu), and titanium (Ti) and include a single layer or a multi-layer including the above materials.

The first gate insulating layer 112 between the semiconductor layer A and the gate electrode G may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode G. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The top electrode CE2 of the storage capacitor Cst may be arranged on the second gate insulating layer 113. The top electrode CE2 may overlap the gate electrode G therebelow. In this case, the gate electrode G and the top electrode CE2 that overlap each other with the second gate insulating layer 113 therebetween may constitute the storage capacitor Cst of the pixel circuit. That is, the gate electrode G may serve as the bottom electrode CE1 of the storage capacitor Cst. As described above, the storage capacitor may overlap the thin-film transistor TFT. In an embodiment, the storage capacitor Cst may not overlap the thin-film transistor TFT.

The top electrode CE2 may include a single layer or a multi-layer including aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu).

The interlayer insulating layer 114 may cover the top electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the inorganic insulating material.

A drain electrode D and a source electrode S may be arranged on the interlayer insulating layer 114. The drain electrode D and the source electrode S may include a material having excellent conductivity. The drain electrode D and the source electrode S may include a conductive material including molybdenum (Mo), aluminum (Al), copper (Cu), and titanium (Ti) and have a single-layered or multi-layered structure including the above materials. In an embodiment, the drain electrode D and the source electrode S may have a multi-layered structure of Ti/Al/Ti.

The first planarization layer 115 may cover the drain electrode D and the source electrode S. The first planarization layer 115 may include an organic insulating layer. The first planarization layer 115 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

A connection electrode CML may be arranged on the first planarization layer 115. In this case, the connection electrode CML may be connected to the drain electrode D or the source electrode S through a contact hole of the first planarization layer 115. The connection electrode CML may include a material having excellent conductivity. The connection electrode CML may include a conductive material including at least one of molybdenum (Mo), aluminum (Al), copper (Cu), and titanium (Ti) and include a single layer or a multi-layer including the above materials. In an embodiment, the connection electrode CML may have a multi-layered structure of Ti/Al/Ti.

The second planarization layer 116 may cover the connection electrode CML. The second planarization layer 116 may include an organic insulating layer. The second planarization layer 116 may include an organic insulating material such as a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display element layer DEL may be arranged on the pixel circuit layer PCL. The display element layer DEL may include a display element DE. The display element DE may be an organic light-emitting diode OLED. A pixel electrode 211 of the display element DE may be electrically connected to the connection electrode CML through a contact hole of the second planarization layer 116. Though it is shown in FIG. 8 that the pixel electrode 211 of the display element DE is electrically connected to the thin-film transistor through the connection electrode CML, the connection electrode CML may be omitted in some implementations, and the pixel electrode 211 of the display element DE may be directly connected to the thin-film transistor.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 211 may further include a layer including ITO, IZO, ZnO, or $In_2O_3$ on/under the reflective layer.

A pixel-defining layer 118 may be arranged on the pixel electrode 211, the pixel-defining layer 118 including an opening 1180P that exposes the central portion of the pixel electrode 211. The pixel-defining layer 118 may include an organic insulating material and/or an inorganic insulating material. The opening 1180P may define an emission area EA of light (hereinafter, referred to as emission area) emitted from the display element DE. As an example, the width of the opening 1180P may correspond to the width of the emission area EA of the display element DE.

A spacer 119 may be arranged on the pixel-defining layer 118. The spacer 119 is designed to prevent the destruction of the substrate 101 in a method of manufacturing a display apparatus. While a display panel is manufactured, a mask sheet may be used. A deposition material is deposited on the substrate 101 with the mask sheet entering the inside of the opening 1180P of the pixel-defining layer 118 or in close contact with the pixel-defining layer 118. In this case, the spacer 119 may prevent a defect of the substrate 101 such as the destruction of or the damage to a portion of the substrate 101 due to the mask sheet.

The spacer 119 may include an organic insulating material such as polyimide. Alternatively, the spacer 119 may include an inorganic insulating material such as silicon nitride or silicon oxide, or include an organic insulating material and an inorganic insulating material.

In an embodiment, the spacer 119 may include a material different from the pixel-defining layer 118. Alternatively, in another embodiment, the spacer 119 may include the same material as the pixel-defining layer 118. In this case, the pixel-defining layer 118 and the spacer 119 may be simultaneously formed during a mask process that uses a half-tone mask, etc.

An intermediate layer 212 may be arranged on the pixel-defining layer 118. The intermediate layer 212 may include an emission layer 212b arranged in the opening 1180P of the pixel-defining layer 118. The emission layer 212b may include a polymer or low-molecular weight organic material that emits light of a preset color.

A first functional layer 212a and a second functional layer 212c may be respectively arranged under and on the emission layer 212b. The first functional layer 212a may include, for example, a hole transport layer (HTL), or include an HTL and a hole injection layer (HIL). The second functional layer 212c is arranged on the emission layer 212b and may be omitted. The second functional layer 212c may include an electron transport layer (ETL) and/or an electron injection layer (EIL). Like an opposite electrode 213 described below, the first functional layer 212a and/or the second functional layer 212c may be a common layer entirely covering the substrate 101.

The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or an alloy thereof. Alternatively, the opposite electrode 213 may further include a layer including ITO, IZO, ZnO, or $In_2O_3$ on the (semi) transparent layer including the above material.

In an embodiment, a capping layer (not shown) may be further arranged on the opposite electrode 213. The capping layer may include lithium fluoride (LiF), an inorganic material, and/or an organic material.

The thin-film encapsulation layer TFE may be arranged on the opposite electrode 213. In an embodiment, the thin-film encapsulation layer TFE includes at least one inorganic encapsulation layer and at least one organic encapsulation layer. It is shown in FIG. 8 that the thin-film encapsulation layer TFE includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Though not shown, a touch electrode layer may be arranged on the thin-film encapsulation layer TFE. An optical functional layer may be arranged on the touch electrode layer. The touch electrode layer may obtain coordinate information corresponding to an external input, for example, a touch event. The optical functional layer may reduce the reflectivity of light (external light) incident toward a display apparatus from the outside and/or improve color purity of light emitted from the display apparatus. In an embodiment, the optical functional layer may include a retarder and/or a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the optical functional layer may include a black matrix and color filters. The color filters may be arranged by taking into account colors of light respectively emitted from the pixels of the display apparatus. Each of the color filters may include a red, green, or blue pigment or dye. Alternatively, each of the color filters may further include quantum dots in addition to the pigment or dye. Alternatively, some of the color filters may not include the pigment or dye and may include scattering particles such as titanium oxide.

In another embodiment, the optical functional layer may include a destructive interference structure. The destructive interference structure may include a first reflection layer and a second reflection layer respectively arranged on different layers. First-reflected light and second-reflected light respectively reflected by the first reflection layer and the second reflection layer may destructively interfere, and thus, the reflectivity of external light may be reduced.

An adhesive member may be arranged between the touch electrode layer and the optical functional layer. The adhesive member generally known in the art may be employed without limitation. The adhesive member may be a pressure sensitive adhesive (PSA).

According to various embodiments, because a semiconductor pattern continuously extending in a first direction is formed as one body, a defective pixel issue such as the destruction of the semiconductor pattern due to external electrostatic discharge may be resolved. Therefore, a defect of a display apparatus may be prevented.

Up to this point, though only the display apparatus has been mainly described, the present disclosure is not limited thereto. As an example, a method of manufacturing the display apparatus also falls within the scope of the present disclosure.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
a first pixel including a first node;
a second pixel neighboring the first pixel and including a second node; and
an always-off thin-film transistor including a first electrode, a second electrode, and a gate electrode, the first electrode being connected to the first node of the first pixel, the second electrode being connected to the second node of the second pixel, wherein a turn-off voltage is applied to the gate electrode.

2. The display apparatus of claim 1, wherein the always-off thin-film transistor includes a semiconductor pattern connecting the first node to the second node.

3. The display apparatus of claim 2, wherein the first pixel includes:
a first light-emitting element;
a first driving thin-film transistor configured to control a current flowing through the first light-emitting element according to a first gate-source voltage;
the first node to which a driving voltage is applied;
a first emission control thin-film transistor configured to connect the first node to a source of the first driving thin-film transistor in response to an emission control signal; and
a first gate initialization thin-film transistor configured to apply a first initialization voltage to a gate of the first driving thin-film transistor in response to a first scan signal.

4. The display apparatus of claim 3, wherein the turn-off voltage is the driving voltage.

5. The display apparatus of claim 3, wherein the second pixel includes:
a second light-emitting element;
a second driving thin-film transistor configured to control a current flowing through the second light-emitting element according to a second gate-source voltage;
a second gate initialization thin-film transistor configured to apply the first initialization voltage to a gate of the second driving thin-film transistor in response to a second scan signal; and
the second node to which the first initialization voltage is applied when the second gate initialization thin-film transistor is turned on in response to the second scan signal.

6. The display apparatus of claim 5, wherein the second gate initialization thin-film transistor includes a plurality of thin-film transistors connected to each other in series, and the second node is arranged between the plurality of thin-film transistors.

7. The display apparatus of claim 6, wherein the second node is in a floated state when the plurality of thin-film transistors are turned off in response to the second scan signal.

8. The display apparatus of claim 5, wherein the first pixel further includes an anode initialization thin-film transistor configured to apply a second initialization voltage to an anode of the first light-emitting element in response to the second scan signal.

9. The display apparatus of claim 8, wherein the first pixel further includes:
a storage capacitor including a top electrode and a bottom electrode, the driving voltage being applied to the top electrode, and the bottom electrode being connected to the gate of the first driving thin-film transistor;
a scan thin-film transistor configured to transfer a data voltage to the source of the first driving thin-film transistor in response to a third scan signal;
a compensation thin-film transistor configured to operate in response to the third scan signal and connected between a drain and the gate of the first driving thin-film transistor; and
a second emission control thin-film transistor configured to connect the drain of the first driving thin-film transistor to the anode of the first light-emitting element in response to the emission control signal.

10. The display apparatus of claim 3, wherein the second pixel includes:
a second light-emitting element;
a second driving thin-film transistor configured to control a current flowing through the second light-emitting element according to a gate-source voltage; and
a second gate initialization thin-film transistor configured to apply the first initialization voltage to the gate of the second driving thin-film transistor in response to a second scan signal,
wherein the second node is a source or a drain of the second gate initialization thin-film transistor.

11. The display apparatus of claim 1, further comprising a data line extending in a first direction,
wherein the first pixel neighbors the second pixel in the first direction.

12. The display apparatus of claim 1, wherein the first pixel is electrically insulated from the second pixel by the always-off thin-film transistor.

13. The display apparatus of claim 1, wherein the gate electrode of the always-off thin-film transistor is connected to the first electrode, and the turn-off voltage is applied to the first electrode.

14. A display apparatus comprising:
a plurality of pixels each arranged in a first direction and including a light-emitting element, a first node, and a second node, a driving voltage being applied to the first node, and a first initialization voltage being selectively applied to the second node; and
a plurality of always-off thin-film transistors alternately arranged with the plurality of pixels in the first direction,
wherein each of the plurality of always-off thin-film transistors physically connects the first node of a first pixel to the second node of a second pixel from among two neighboring pixels of the plurality of pixels.

15. The display apparatus of claim 14, further comprising a semiconductor pattern as one body that continuously extends in the first direction,
wherein the semiconductor pattern includes a plurality of pixel areas and a plurality of transistor areas, the plurality of pixel areas being respectively included in the plurality of pixels, and the plurality of transistor areas being respectively included in the plurality of always-off thin-film transistors.

16. The display apparatus of claim 14, wherein each of the plurality of pixels includes:
- a driving thin-film transistor configured to control a current flowing through the light-emitting element according to a gate-source voltage;
- a scan thin-film transistor configured transfer a data voltage to the driving thin-film transistor in response to a first scan signal; and
- a storage capacitor including a first electrode and a second electrode, the first electrode being connected to a gate of the driving thin-film transistor.

17. The display apparatus of claim 16, wherein each of the plurality of pixels further includes a compensation thin-film transistor configured to connect a drain to the gate of the driving thin-film transistor in response to the first scan signal.

18. The display apparatus of claim 17, wherein each of the plurality of pixels further includes a gate initialization thin-film transistor configured to apply the first initialization voltage to the gate of the driving thin-film transistor in response to a second scan signal.

19. The display apparatus of claim 18, wherein each of the plurality of pixels further includes:
- a first emission control thin-film transistor configured to connect the first node to a source of the driving thin-film transistor in response to an emission control signal; and
- a second emission control thin-film transistor configured to connect the drain of the driving thin-film transistor to an anode of the light-emitting element in response to the emission control signal.

20. The display apparatus of claim 19, wherein each of the plurality of pixels further includes an anode initialization thin-film transistor configured to apply a second initialization voltage to the anode of the light-emitting element in response to a third scan signal.

* * * * *